United States Patent
Cros et al.

(10) Patent No.: US 9,653,136 B2
(45) Date of Patent: May 16, 2017

(54) MEMORY DEVICE, COMPRISING AT LEAST ONE ELEMENT AND ASSOCIATED METHOD SPINTRONICS

(71) Applicants: THALES, Courbevoie (FR); CENTRE NATIONAL DE LA RECHERCHE SCIENTIFIQUE (C.N.R.S.), Paris (FR); Université Paris-Sud, Orsay (FR)

(72) Inventors: Vincent Cros, Paris (FR); Albert Fert, Palaiseau Cedex (FR); Joao Sampaio, Paris (FR); Pierre Seneor, Paris (FR)

(73) Assignees: THALES, Courbevoie (FR); CENTRE NATIONAL DE LA RECHERCHE SCIENTIFIQUE (C.N.R.S.), Paris (FR); UNIVERSITÉ PARIS-SUD, Orsay (FR)

(*) Notice: Subject to any disclaimer, the term of this patent is extended or adjusted under 35 U.S.C. 154(b) by 0 days.

(21) Appl. No.: 14/908,990

(22) PCT Filed: Aug. 1, 2014

(86) PCT No.: PCT/EP2014/066666
§ 371 (c)(1),
(2) Date: Jul. 11, 2016

(87) PCT Pub. No.: WO2015/015007
PCT Pub. Date: Feb. 5, 2015

(65) Prior Publication Data
US 2016/0314827 A1 Oct. 27, 2016

(30) Foreign Application Priority Data
Aug. 1, 2013 (FR) ........................ 13 01854

(51) Int. Cl.
*G11C 11/00* (2006.01)
*G11C 11/16* (2006.01)
(Continued)

(52) U.S. Cl.
CPC ......... *G11C 11/1675* (2013.01); *G11C 11/16* (2013.01); *G11C 11/1673* (2013.01); *G11C 19/08* (2013.01); *H01L 43/10* (2013.01)

(58) Field of Classification Search
CPC ..................................................... G11C 11/00
(Continued)

(56) References Cited

U.S. PATENT DOCUMENTS

2011/0261602 A1* 10/2011 Moutafis ............... B82Y 10/00
365/8

OTHER PUBLICATIONS

Fert et al., "Skyrmions on the Track", Nature Nanotechnology, Mar. 5, 2013, pp. 152-156, vol. 8, Extrait de l'Internet: URL:http://www.nature.com/nnano/journal/v8/n3/pdf/nnano.2013.29.pdf.
(Continued)

*Primary Examiner* — Hoai V Ho
(74) *Attorney, Agent, or Firm* — Thompson Coburn LLP

(57) ABSTRACT

A storage device, comprising at least one spintronic element suitable for representing a state among at least n states associated with the spintronic element, n>1, characterized in that each of the n states is associated with at least one characteristic of a group of magnetic skyrmions in the spintronic element, and in that said characteristic associated with a state n °i is different from said characteristic associated with a state n °j when the states n °i and n °j are two different states among the n states.

13 Claims, 3 Drawing Sheets

(51) Int. Cl.
  *G11C 19/08*   (2006.01)
  *H01L 43/10*   (2006.01)
(58) Field of Classification Search
  USPC .......................................................... 365/158
  See application file for complete search history.

(56) References Cited

OTHER PUBLICATIONS

Fert et al., "Skyrmions, High Density Information Storage, Spintronic Devices", Feb. 4, 2013, 71 pages, Extrait de l'Internet: URL:https://www.ntu.edu.sg/ias/upcomingevents/SCHLDS13/Documents/LectureNotes/AlbertFert_04Feb13_Lecture2.pdf.
Preliminary Search Report for FR Application1301854 dated May 22, 2014.
Romming et al., "Writing and Deleting Single Magnetic Skyrmions", Science, Aug. 9, 2013, pp. 636-639, vol. 341, No. 6146.
Tchoe et al., "Skyrmion Generation by Current", Physical Review B, May 12, 2012, vol. 85 No. 17, XP055119150, Entire document.

\* cited by examiner

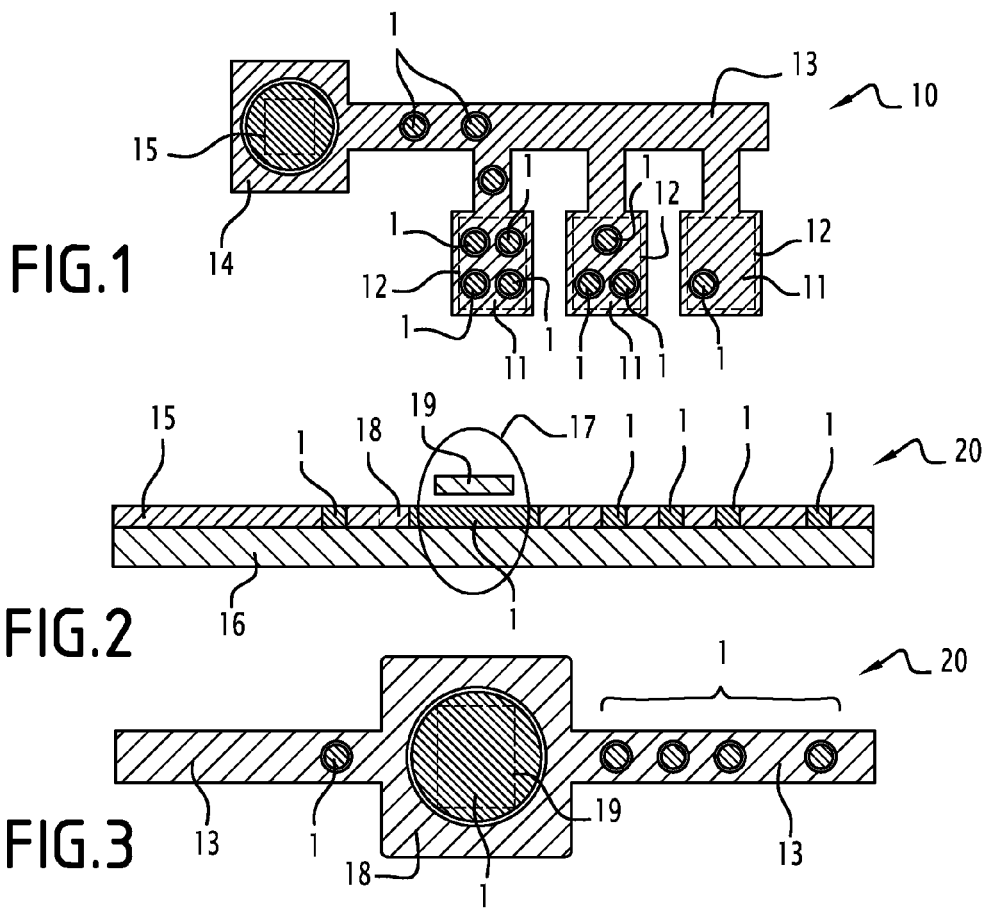
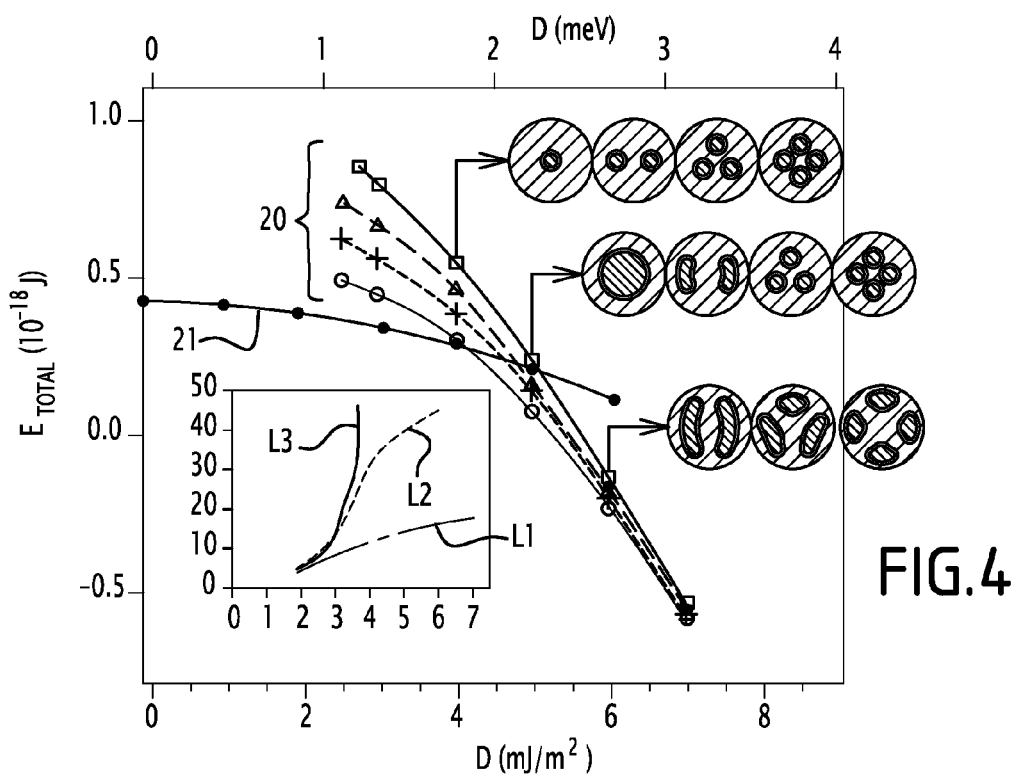

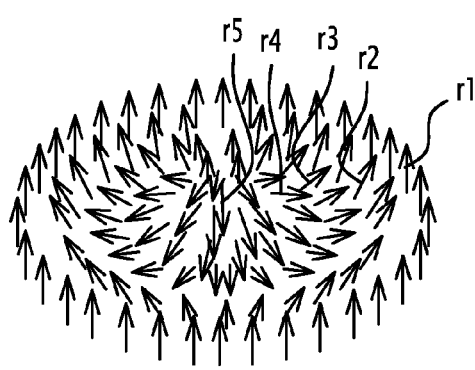
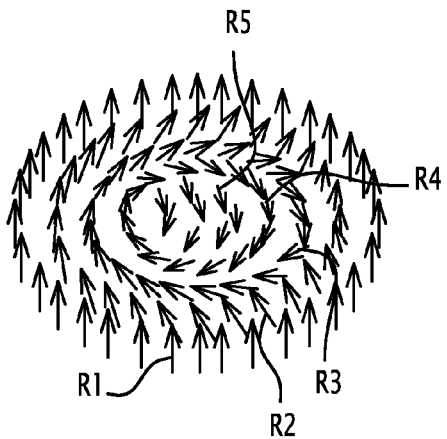
FIG.5  FIG.6
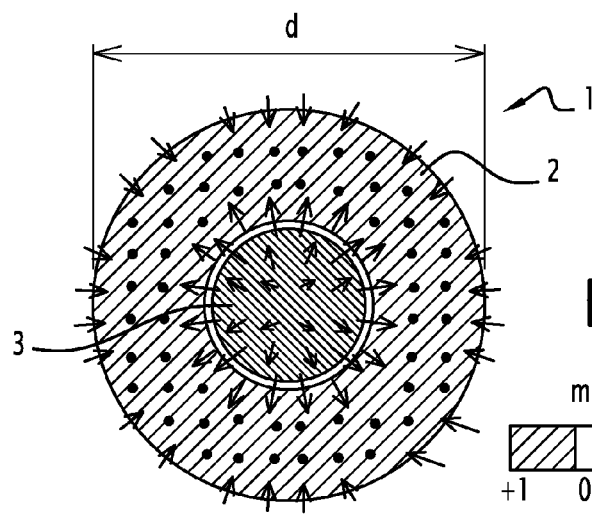
FIG.7
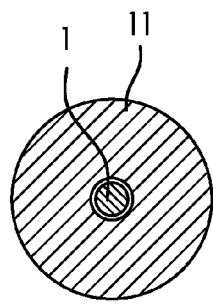 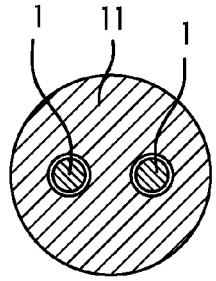 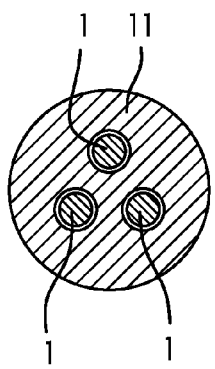 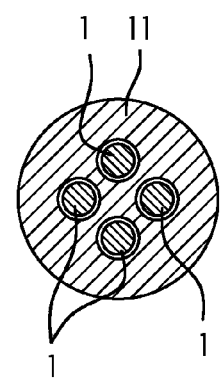
FIG.8  FIG.9  FIG.10  FIG.11

MEMORY DEVICE, COMPRISING AT LEAST ONE ELEMENT AND ASSOCIATED METHOD SPINTRONICS

CROSS-REFERENCE TO RELATED APPLICATIONS

This application is a U.S. National Phase application of PCT/EP2014/066666, filed on Aug. 1, 2014, claiming the benefit of FR Application No. FR 13 01854, filed Aug. 1, 2013, both of which are incorporated herein by reference in their entireties.

The present invention relates to a memory device, comprising at least one spintronic element adapted for representing a state from among at least n states associated with a spintronic element, n being greater than 1.

As a reminder, the spintronic field, further called spin electronic field, is a field of electronics using the spin of the electron as an information vector.

Such memory devices are for example bulk storage devices, shift registers, logic devices and analog memories for example for circuits of the neuro-inspired type.

All these memory elements with spintronic element(s) which have the advantage of being non-volatile, CMOS compatible and resistant to electromagnetic radiations, are based on a spintronic element called a Magnetic Tunnel Junction (MTJ) which is a stack mainly consisting of two thin magnetic layers (a few nanometers) separated by an insulating layer (of the order of one nanometer).

For a spintronic element of the binary memory type, the bit of the memory corresponds to an MTJ with a side of a few tens to a few hundred nanometers, for which the state, alternatively 0 and 1, is obtained by two possible configurations of the relative direction of the magnetizations in both magnetic layers (either parallel or antiparallel). Reading the state of the memory is accomplished by measuring the voltage on the terminals of the MTJ by means of the magneto-resistance effect with a tunnel effect, also called Tunnel Magnetic Resistance TMR. The writing of the state is achieved, in the last element generations (called STT-MRAM for Spin-Transfer Torque Magnetic Random-Access Memory), by a spin transfer effect (Spin Transfer Torque noted as STT) which gives the possibility of acting on the direction of the magnetization(s) and therefore of modifying their configuration by injecting a spin-polarized current, passing from parallel to antiparallel or vice versa, without requiring application of a magnetic field.

In more complex devices such as shift register devices or spintronic memristors, the state modifications are based on the controlled displacement of walls of magnetic domains. In the same way as for binary memory spintronic elements, reading is achieved by a magnetoresistive effect and writing is achieved by a spin transfer effect.

Several technical problems remain to be solved in existing technologies of memory devices with spintronic element(s). First, it is necessary to reduce the energy consumption associated with the writing of information. Indeed, the energy cost has increased with the reduction of the dimensions of the components. This increase is related to the requirement of preserving or even increasing the efficiency of the spin transfer effects which are used for writing information (by reversal of the magnetization direction) and to the increased influence of the natural defects or related to the nano-manufacturing, which impose increasingly large current densities to be injected in order to attain non-stochastic writing conditions.

It is also desirable, while reducing the electric consumption (used for the different functions of the memory), to preserve a sufficient measured signal intensity for good detection of the state of the memory.

Secondly, it is necessary to increase the information density which may be stored in non-volatile spintronic memories, which may either be done by increasing the integration level (i.e. reducing the size of the individual bit) or by going beyond standard memory architectures which are binary.

A solution consists of having multistate memories, further said to be with multilevels. However, in the existing magnetic memories, the switching between two different directions of the uniform magnetizations only gives the possibility of coding one single bit per memory element. The existence of multistate memories would allow a large increase in the storage density and reduction in the cost thereof.

With the purpose of tackling the major problems of spintronic element memories (MRAM or further shift register memory based on walls of magnetic domains), according to a first aspect, the invention thus proposes a memory device, comprising at least one spintronic element of the aforementioned type, characterized in that each of the end states is associated with at least one characteristic of a set of magnetic skyrmions in the spintronic element, and in that said characteristic associated with a state n °i is distinct from said characteristic associated with a state n °j when the states n °i and j are two distinct states from among the n states.

Such a device gives the possibility of providing a memory with multiple states, of increasing the information density which may be stored, as compared with the spintronic memory device of the prior art, and of reducing the energy consumption associated with the writing of information.

The present invention thus aims at proposing a solution giving the possibility of solving the technical problems indicated above by using chiral magnetic configurations which the magnetic skyrmions are, as an information support with a multi-state memory element.

Skyrmions are topological entities which have a chiral spin structure (i.e. a symmetrical spin structure with respect to a planar mirror), the size of which may be extremely small (as small as a few atomic cells) and the direction of rotation is imposed.

The configuration of the spin structures may be of the "harrow" type (cf. FIG. 5 wherein the arrows indicate the orientation of the spins organized in concentric circles r1, r2, r3, r4 and r5) or "vortex" (cf. FIG. 6 where the arrows indicate the orientation of the spins organized in concentric circles R1, R2, R3, R4 and R5).

These chiral magnetic structures were predicted and observed in crystals such as MnSi, FeCoSi or further FeGe having a crystalline structure exhibiting inversion symmetry breaking. In systems of magnetic thin films which are those considered by the invention, the required inversion symmetry breaking for the stabilization of a chiral magnetic structure is induced by the presence of an interface between a magnetic thin film and a thin film with strong spin-orbit coupling (further called SOC or Spin-Orbit Coupling), which generates a strong DM interaction, characterized by a parameter called D, giving rise to stabilization of magnetic configurations of the skyrmion type.

As a reminder, SOC describes interactions between the spin of a particle (the electron in our case) and its motion, and is of particular importance in magnetism, and particularly in spintronics, for explaining a certain number of fundamental properties of materials such as for example magnetic anisotropies, magnetoresistive effects or further magnetization relaxation processes.

The invention utilizes these spin-orbit interactions for generating and/or displacing these magnetic states, called magnetic skyrmions, in systems of the nano-structure type.

It will be noted that skyrmions are topologically protected and therefore relatively stable to variations of the outer parameters; they cannot be transformed (once they are stabilized) for a transition towards another magnetic order (quasi-uniform order or vortex for example. As indicated earlier, magnetic skyrmions were only observed in 2009 in systems of the single-crystal type (MnSi, FeCoSi, FeGe . . . ) exhibiting lack of inversion symmetry related to the crystalline structure. These so-called bulk systems cannot be strongly reduced in thickness, are not compatible with CMOS technologies and above all they only exhibit the phase including ultra-dense lattices of skyrmions at a low temperature and under a magnetic field.

In addition to spin-orbit interaction, other types of magnetic interaction, for example dipolar interactions, may allow stabilization of the chiral magnetic configurations in nanostructures, which are called magnetic bubbles which may have, in the case of systems of magnetic thin films, a spin structure as a harrow, as shown in FIG. 6. In the present document, notably in the description and the claims hereafter, the spin structures shown in FIG. 6 are grouped together under the general term of magnetic skyrmion.

In embodiments, the memory device according to the invention further includes one or several of the following features:

the characteristic illustrates a number of magnetic skyrmion(s) present in the spintronic element and/or an electric resistance level of the whole of the magnetic skyrmion(s);

it comprises means for writing states suitable for receiving an identifier of a state from among said at least n states and suitable for modifying the whole of the magnetic skyrmions in the spintronic element so that the characteristic of the modified set of skyrmions is equal to a predefined value associated with the state identified by the received identifier;

the state-writing means comprise means for generating skyrmion(s) suitable for being locally applied to the spintronic element, or to any other spintronic element in the memory device and connected to the spintronic element through a track for displacement of the skyrmions, a spin-polarized current or a local electric field or a local magnetic field for generating a determined number of skyrmion(s);

the means for generating skyrmion(s) are adapted for energetically stabilizing the state of said element or other spintronic element according to said number of skyrmions to be generated and to the relationship between the magnetic energy and chiral magnetic interaction of the spintronic element;

the state-writing means comprise means for stabilizing said skyrmion(s) generated on said element, or other spintronic element, by modifying at least one magnetic parameter on the edges of said element, or other spintronic element;

the state-writing means comprise means for stabilizing said skyrmion(s) generated on said element or other spintronic element, by modifying at least one magnetic parameter by using a piezoelectric device suitable for changing the structural parameters of said element, or other spintronic element;

the state-writing means comprise at least one track and comprise means for displacing skyrmions by a spin transfer effect suitable for introducing skyrmion(s) from the track into the spintronic element and/or for extracting skyrmion(s) from the spintronic element towards the track;

it comprises state-reading means adapted for measuring the magneto-resistance of said spintronic element or of another spintronic element of the memory device and for determining, according to at least said measured magneto-resistance, the state associated with the spintronic element from among the n states;

said state-reading means are adapted for determining, according to said at least measured magneto-resistance, a number of skyrmions present in said spintronic element and for inferring therefrom the state of the spintronic element as equal to the state associated with said determined number of skyrmions;

it comprises a track allowing displacement of skyrmions, one after the other, by a spin transfer effect, comprising, in a point along the track, a widened area and reading means adapted for measuring the electric resistance of a spintronic element in the widened area;

said spintronic element comprises at least one ferromagnetic layer comprising at least one material from Fe, Co or Ni, a ferromagnetic perovskite either simple or double based on Ti, Cr, Mn, Fe, Co, Mo or Ru, a Heusler alloy based on Fe, Co or Ni or a magnetic semi-conductor, said ferromagnetic layer being interfaced with a non-magnetic layer;

said spintronic element comprises at least one non-magnetic layer comprising at least one material from among the elements Pt, W, Ir, Re, Ta, Pb, Bi, Rh, Pd, Mo, Cu or further Sm, Gd, Tb or Er, said non-magnetic layer being interfaced with a ferromagnetic layer or a stack of ferromagnetic and/or non-magnetic layer(s).

According to a second aspect, the present invention proposes a processing method in a memory device comprising at least one spintronic element adapted for representing a state from among at least n states associated with the spintronic element, $n>1$, characterized in that each of the n states is associated with at least one characteristic of a set of magnetic skyrmions in the spintronic element, said characteristic associated with a state n $°i$ being distinct from said characteristic associated with a state n $°j$ when the states n $°i$ and j are two distinct states from among the n states.

These characteristics and advantages of the invention will become apparent upon reading the description which follows, only as an example and made with reference to the appended drawings, wherein:

FIG. 1 is a top view of a memory device in an embodiment of the invention;

FIG. 2 is a side view of a memory device in an embodiment of the invention;

FIG. 3 is a top view of the memory device of FIG. 2;

FIG. 4 represents the time-dependent change in the total energy of a nanostructure according to the invention according to a parameter D; the insert of FIG. 4 illustrates the time-dependent change in the diameter of a skyrmion according to D for various diameters of the nanoplot;

FIG. 5 is a view of a skyrmion structure type;

FIG. 6 is a view of another skyrmion structure type;

FIG. 7 is a view of a skyrmion in a nanoplot;

FIGS. 8 to 11 illustrate views of a nanoplot including distinct numbers of skyrmions;

Figure 12:
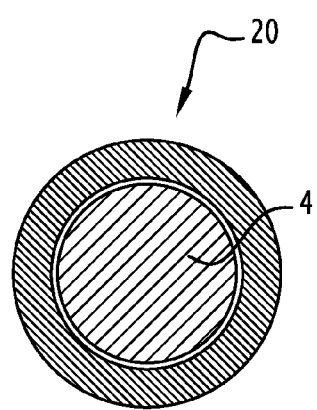
FIGS. 12 to 13 illustrate views of a nanoplot associated with distinct states in an embodiment of the invention.

The invention proposes the use of these chiral magnetic configurations which the magnetic skyrmions are, as a support for information for a multi-state memory element.

In an embodiment, the invention uses as a base structure designated as BS hereafter, a quasi two-dimensional hybrid system (since it includes film thicknesses of a few atomic planes which are much smaller than the other dimensions of the system) including a nanostructure consisting of at least one stack of an ultra-thin layer in a ferromagnetic material and of a layer of a non-magnetic metal with strong SOC.

In an embodiment, the magnetic ultra-thin film is replaced with a stack of layers comprising ferromagnetic layer(s) (and optionally non-ferromagnetic layer(s)), such as for example Co/Ni/Co/Ni, but the symmetry breaking at one or several of the interfaces with a material with strong SOC should be preserved.

The symmetry breaking existing at the interface between both of these layers is used for facilitating the generation and stabilization of skyrmions in a limited and controlled number (cf. Fert et al, Nature Nano, 8, 152(2013)).

An experimental observation at a very low temperature of lattices of skyrmions in a ultra-thin hybrid system including an ultra-thin layer of Fe on Ir (111), is for example described in "Spontaneous atomic-scale magnetic skyrmion lattice in two dimensions", Heinze et al., Nature Physics, 2011.

The materials used for making up the magnetic layer of the BS structure may be typically iron (Fe), cobalt (Co), nickel (Ni) or an alloy based on these metals or a multilayer with perpendicular magnetization or stacks of such magnetic materials or a simple or double ferromagnetic perovskite based on Ti, Cr, Mn, Fe, Co, Mo or Ru, or Heusler type alloys or magnetic semi-conductors, for example GaMnAs, or magnetic organic layers. Typically, the thickness of said ferromagnetic layer(s) is of a few atomic planes, and is between 0.2 nm and 3 nm.

The materials used for forming the layer with strong spin-orbit coupling may for example be, according to the periodic table of the elements, a $5d$ element such as platinum (Pt), tungsten (W), iridium (Ir), rhenium (Re), tantalum (Ta), lead (Pb), bismuth (Bi) or further a $4d$ element like palladium (Pd), rhodium (Rh), or an alloy of certain of these elements or else a stack of such materials for example Bi/Ag (Ag represents silver) or Au/Ag wherein Au represents gold or further a $3d$ element such as copper (Cu) or molybdenum (Mo) or else a rare earth element like samarium (Sm), gadolinium (Gd), terbium (Tb) or erbium (Er) for example.

Typically, the thickness of the layer with strong SOC is between 0.2 nm and 10 nm.

Such a nanostructure gives the possibility of obtaining isolated skyrmions in a controllable number.

The invention relates to memory devices comprising one or several BS nanostructures.

A top view of such a BS nanostructure forming a spintronic element 1, called a nanoplot hereafter, of a memory device according to the invention is illustrated in FIG. 7. In the relevant state, the nanoplot 1 with a diameter d equal to 80 nanometers (nm) includes on the Co ferromagnetic layer 3, a stabilized magnetic skyrmion 3. The direction of the magnetization is indicated by the arrows and $m_z$ illustrates the component of the magnetization pointing out of the plane of the magnetic film(s). The latter has been normalized with respect to the value of the saturation magnetization and the value of $m_z$ represents the direction towards which the magnetization points: it has the value +1 when it points upwards, 0 when it is in the plane of FIGS. 7 and −1 when it points downwards. Three curves, drawing concentric circles in the case shown in FIG. 7, delimit respective areas in which $m_z$ belongs to [−1; 0 [ (narrow welts), $m_z$ is equal to 0 (no welts) and $m_z$ belongs to ]0; 1[ (wider welts). The variations of the values of $m_z$ between −1 and +1 are gradually made.

In an embodiment of the invention, distinct states of a memory element with multiple states including a BS nanostructure are defined and each defined state is associated with a respective number of skyrmions. The state of the memory element is thus determined, during the reading and the writing of the memory element, according to the number of skyrmions shown by this element. For this embodiment, the reading may be accomplished either by counting the number of skyrmions injected into the memory element by placing upstream an element such as the one indicated as 13 in FIG. 3 or by measuring the resistance of the element (with matching between resistance and number of skyrmions).

For example, FIG. 8 shows a nanoplot illustrating a memory element 11, and including a magnetic skyrmion 1, this value of the number of skyrmions being for example associated with the state "00" of the memory element. FIG. 9 illustrates the memory element 11 including two skyrmions 1, this value of the number of skyrmions being associated for example with the state "01" of the memory element. FIG. 10 shows the memory element 11 including three skyrmions 1, this value of number of skyrmions being associated for example with the state "10" of the memory element. FIG. 11 represents the memory element 11 including four skyrmions 1, this value of the number of skyrmions being associated for example with the state "11" of the memory element.

It is noted that a state of the memory is associated with a zero number of magnetic skyrmions in an embodiment.

In an embodiment of the invention, distinct states of a multi-state memory element, for example a nanoplot, including a BS nanostructure, are associated with distinct electric resistance levels of the nanoplot corresponding to a given chiral magnetic configuration.

Figure 13:
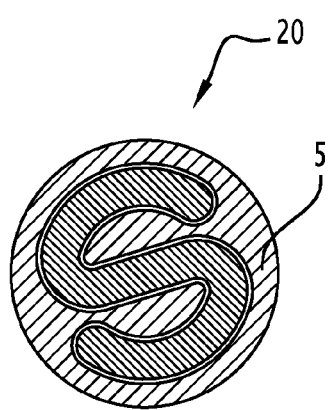

As an illustration, FIG. 12 shows a nanoplot illustrating a memory element 20, and including a magnetic skyrmion 4 having a given shape, giving rise to a value $\Omega_{12}$ of electric resistance of the nanoplot 20 including the skyrmion 4, this electric resistance value $\Omega_{12}$ being associated for example with the state "00" of the memory element. FIG. 13 shows the nanoplot 20, and including a magnetic skyrmion 5 exhibiting another given shape, giving rise to an electric resistance value $\Omega_{13}$ of the nanoplot 20 including the skyrmion 5, this electric resistance value $\Omega_{13}$ being for example associated with the state "01" of the memory element.

In another embodiment, as an illustration, the respective FIGS. 14 to 17 show a nanoplot illustrating a memory element 21 in distinct respective states "00", "01", "10" and "11" for example. Each of these states, "00", "01", "10" and "11" respectively, corresponds to a distinct electric resistance value, $\Omega_{00}$, $\Omega_{01}$, $\Omega_{10}$, $\Omega_{11}$ respectively of the nanoplot 21, which depends on the shape of the set of magnetic skyrmion(s) appearing in the nanoplot 21.

Figure 14:
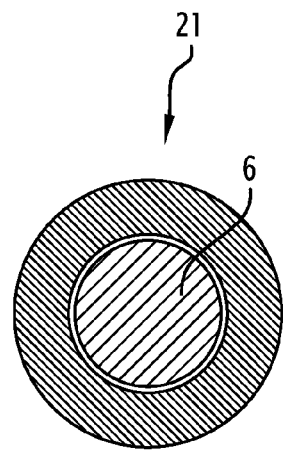
FIGS. 14 to 17 illustrate views of a nanoplot associated with distinct states in an embodiment of the invention.
Figure 15:
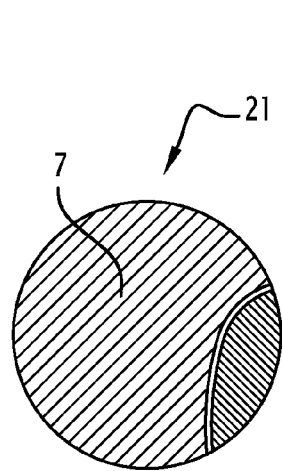
Figure 16:
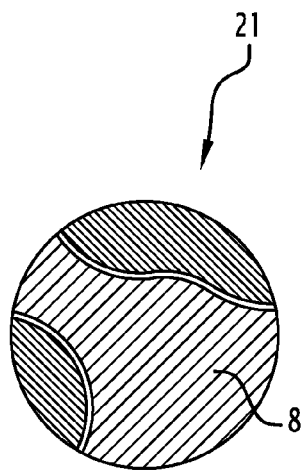
Figure 17:
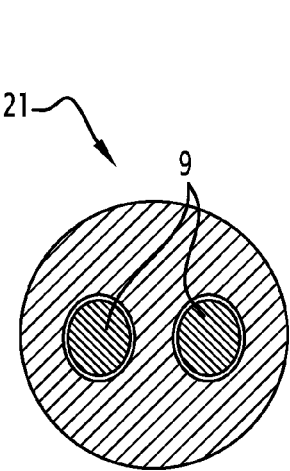

The configuration of the set 6 of skyrmion(s) present in the nanoplot 21 illustrated in FIG. 14 requires the existence of one skyrmion. The configuration of the set 7 of skyrmion(s) present in the nanoplot 21 illustrated in FIG. 15 requires the existence of a skyrmion, partly present in the nanoplot 21. The configuration of the set 8 of skyrmion(s) present in the nanoplot 21 illustrated in FIG. 16 requires the existence of two skyrmions, partly present in the nanoplot 21. The configuration of the set 9 of skyrmion(s) present in the nanoplot 21 illustrated in FIG. 17 requires the existence of two skyrmions present in the nanoplot 21.

A memory device according to the invention is adapted for generating magnetic skyrmions in a nanoplot, is adapted for writing a state in a memory element of the nanoplot type, and is adapted for reading a memory element of the nanoplot type and for inferring the state thereof.

In the relevant case here, the nanoplots have a cylindrical shape, but may in reality have any shape.

In an embodiment of a memory device according to the invention, the writing means of the memory device are adapted for generating in a stabilized way a set of skyrmions, in a defined number or having a defined electric resistance, directly in the nanoplot of the memory element to be written.

In another embodiment, the skyrmion(s) are generated in a stabilized way in a distinct nanoplot, by writing means of the memory device in a generation operation, for example in a nanoplot being used as a source of skyrmions. Next, in a writing operation, generated skyrmion(s) is(are) displaced, by the writing means of the memory device, from the nanoplot being used a source or from a nanoplot being used as a reserve between the source nanoplot and the memory elements, towards the memory element, the state of which is to be written. The displacement of skyrmions for example are achieved in nanotracks made in the BS nanostructure connecting together the nanoplot in which the skyrmions have been generated or stored, and the nanoplot, the state of which has to be written.

Generation and Stabilization of the Skyrmions—Writing

FIG. 4 illustrates the time-dependent change in the total energy $E_{TOTAL}$ of a nanoplot of BS nanostructure for the ferromagnetic phase of the nanoplot, and if necessary, for the skyrmion phase of the nanoplot, depending on the number of skyrmions when such skyrmions are present on the nanoplot, and depending on the amplitude of the parameter D (mJ/m$^2$) which reflects the magnetic interaction called a Dzyaloshinski-Moriya interaction, noted as DM, which generates a chiral magnetic order which may stabilize a magnetic skyrmion in a nanostructure. Each of the curves 20 corresponds to the phase of skyrmion(s) of the nanoplot, for a distinct number of skyrmion(s) per memory element comprised between one and four. The curve 20 including circles (o) corresponds to 1 skyrmion, the curve 20 including crosses (+) corresponds to 2 skyrmions, the curve 20 including triangles (Δ) corresponds to 3 skyrmions, and the curve 20 including squares (□) corresponds to 4 skyrmions.

A top view of the nanoplot including the skyrmion(s) is further illustrated for values of D equal to 4, 5 and 7 mJ/m$^2$ on the right of the curves 20.

The curve 21 corresponds to the ferromagnetic phase of the nanoplot, i.e. in the absence of skyrmions in the memory element.

It clearly appears from these curves that beyond a certain value of D, the skyrmion phase (curves 20) is metastable with respect to the uniform ferromagnetic phase (curve 21), and then even becomes the lowest energy phase.

According to the invention, the generation, by nucleation, and the stabilization of a set of magnetic skyrmions in a nanoplot having a desired number of skyrmions or further having a desired electric resistance level are produced by local application of a spin-polarized current, typically 10$^7$ to 10$^8$ A/cm$^2$ by using the spin transfer effect, or by applying a local electric field typically from 1 to 5 MV·cm$^{-1}$. Finally, it was recently shown that application of a local magnetic field, typically of a few tens to a few hundred mT, was able to allow stabilization of skyrmions (Kirakosyan, A. S. & Pokrovsky, V. L. From bubble to Skyrmion: Dynamic transformation mediated by a strong magnetic tip. Journal of magnetism and magnetic materials 305, 413-422 (2006)).

Further, in an embodiment of the invention, in order to increase the stabilization of the generated skyrmion(s) in the nanoplot, an operation for modifying the magnetic parameters (magnetization, magnetic anisotropy, DM interaction) on the edges of the nanoplot is applied during the generation of the skyrmion(s). These local modifications may be obtained by localized ion bombardment techniques for example, or else by locally modifying the thickness of the magnetic film, or else further by using a material in contact with the thin magnetic film in the nanoplot having piezoelectric properties, thus allowing control of the structural parameters and therefore magnetic parameters of the film (indeed the DM interaction is purely interfacial and is therefore re-normalized by the thickness of the magnetic film, (by dividing the thickness by 2, the parameter D is multiplied by 2).

Displacement of Magnetic Skyrmions

As mentioned above, in embodiments of a memory device according to the invention, the latter is adapted so as to have skyrmions migrate from a nanoplot adapted for the generation of skyrmions or for storage of these skyrmions, as far as a nanoplot used as a memory element adapted for storing a state of this memory element, which according to the invention is associated either with a given number of skyrmions, or with a resistance level associated with the chiral configuration of a set of magnetic skyrmion(s).

The displacement of a determined number of skyrmions is carried out by a spin transfer effect, for example in a geometry of injection of a spin-polarized current, perpendicularly to the layers or in the plane of the layer with strong SOC, or else by applying a local electric field.

It has been recently demonstrated that skyrmion lattices may be displayed by spin transfer at very low current densities (cf. Jonietz, F. et al. Science 330, 1648-1651 (2010)) and that defects have a small influence on their displacements (cf. I. Wasaki, J. Mocizuki, M. & Nagaosa, N. Nature Commun. 4, 1463 (2013)). This gives the possibility of obtaining a reduced energy cost for the operation of such a memory device.

The spin polarization acting on the magnetic skyrmion(s) by means of the spin transfer effect may be obtained by a spin Hall effect, by the Rashba effect (transfer couple terms are directly related to the spin-orbit effects (SOC) in the normal metal) or more conventionally by using a magnetic tunnel junction. The particularity of these spin transfer terms is that they allow application of these torques for moving the skyrmion(s) forward on the whole of the tracks or elements of the memory.

In nanotracks with a width of a few tens of nm, skyrmion velocities of a few tens of m/s have been obtained by the spin transfer effect, corresponding to current densities of a few MA/cm$^2$, to be compared with a few tens or even a few hundred MA/cm$^2$ for magnetic memories based on domain walls or vortices.

It is thus possible to displace trains of skyrmions without notoriously modifying their sizes, nor the distance between two neighboring skyrmions. This feature is useful for applying the invention to shift register memories based on skyrmions.

It will be noted that further, the shape of the skyrmions and their displacement velocity induced by spin transfer in the nanotrack are not modified by a curvature of the nanotrack.

Reading

In a nanoplot forming a memory element of a device for which the state, in an embodiment of the invention is associated with a respective number of skyrmions present in the memory element, the reading of the memory element comprises the detection, by the memory device, of the number of skyrmions present in the memory element, and then the determination of the state by determining the state associated with a determined number of skyrmions (for example via a table storing the correspondence between the numbers of skyrmions and the associated states). In an embodiment, the reading means of the memory device comprise means for determining the number of skyrmions present in the memory element, by a magneto-resistive transport measurement of the nanoplot.

Indeed, the electric resistance or further the voltage on the terminals of the nanoplot depend on the presence of one or several skyrmions in the nanoplot. A resistance or voltage level is associated with each of the possible states of the memory element, i.e. 1, 2 . . . n skyrmions.

In another embodiment according to the invention, the state of a memory element of a device is associated with a respective electric resistance level shown by a set of skyrmions present in the memory element. The reading of the memory element comprises the measurement of the electric resistance of the set of skyrmion(s) present in the memory element if required, and then the determination of the memory element state by determining the state associated with the measured electric resistance, for example via a table associating resistances of given chiral magnetic configurations and the respectively associated memory states.

Actually, the electric resistance or further the voltage on the terminals of the nanoplot depend on the presence or not of skyrmion(s), as well as on the shape and on the size of the magnetic skyrmion(s) if necessary present.

According to the embodiment, the magnetoresistive measurement is conducted by means of a Hall effect component specifically related to the spin structure of the skyrmions (called a topological Hall effect), by lateral contact for example, by giant magneto-resistance noted as GMR, or further by tunnel magneto-resistance, noted as TMR by placing a magnetic tunnel junction, noted as MTJ, above the memory element . . .).

Size

As indicated earlier with reference to FIG. 4, a top view of a nanoplot including a skyrmion phase is illustrated for values of D equal to 4, 5 and 7 on the right of the curves 20.

From these curves 20 it is inferred that the dimension of a skyrmion increases with the value of the parameter D. This result is the opposite of what is predicted in dense skyrmion lattices: it is thus possible to obtain greater skyrmion densities for smaller parameters D, i.e. for spin-orbit coupling values quite consistent with the one predicted in the 2D systems. As explained hereafter, the invention utilizes this characteristic for modulating, in a memory device according to the invention, and depending on the operations to be carried out, the size of the skyrmions. The size of the individual skyrmions, i.e. in a finite number, in non-dense lattices is thus determined by the competition between the different energy terms of the nanostructure (related to the exchange interaction and the DM interactions) and may attain ultimate dimensions for a magnetic object of a few atomic cells (cf. Heinze, S. et al. Nature Phys. 7, 713-718 (2011)). This characteristic is utilized according to the invention for limiting the size of magnetic skyrmions, notably in nanoplots being used a source of skyrmions and nanoplots being used as a reserve as well as in the nanotracks for guiding the transport of the skyrmions. This characteristic gives the possibility of guaranteeing a very strong integration density of the skyrmions and therefore a very high integration density of the information to be stored.

The curves L1, L2 and L3 within the frame inserted in FIG. 4 represent the time-dependent change in the diameter, in nm, of skyrmions depending on the value of the parameter D, in the case of a BS nanostructure including these skyrmions, the nanoplot having in the plane of the ferromagnetic layer, a diameter of 160 nm for curve L1, 80 nm for curve L2 and 40 nm for curve L3. From these curves, it emerges that the dimensions of the skyrmions depend on the width of the nanoplot or of the track containing these skyrmions.

This characteristic is utilized according to the invention by generating a widened area of the BS nanostructure for locally increasing the size of the skyrmion present in the nanostructure, so as to increase the signal-to-noise ratio during the reading of the widened area with the memory device, for example in the case of an area for counting the number of skyrmions passing one by one in a point of a nanotrack, or further in a memory element.

As an illustration, a view of a portion of a memory device 20 in an embodiment of the invention is illustrated in FIG. 2 (side view) and in FIG. 3 (top view).

This memory device 20 comprises a BS nanostructure consisting of an upper ferromagnetic layer 15 and a lower layer with strong SOC 16 according to the invention, as detailed above, including an area 17 including a nanoplot 18 and a measurement element 19, the nanostructure further including two nanotracks 13 extending the nanoplot on either side.

The measurement element 19 is positioned at the nanoplot 18 and is adapted for determining the presence or not of a skyrmion by a magneto-resistive effect, for example by means of an MTJ junction on the area 17, or by lateral contact of the nanotrack via the Hall effect.

The nanoplot 18 has a widened shape with respect to the nanotracks 13 (i.e. each dimension from among the width and the length of the nanoplot is greater than the smallest dimension of the nanotrack.

A train of skyrmions including several skyrmions 1 is present in the nanotracks 13 and moves, for example from the right of FIG. 2 or 3 to the left, under the effect for example of a spin transfer applied by the memory device on this train of skyrmions, for example by injecting a DC current into the layer with strong SOC 16, which gives the possibility of generating a pure spin current having the proper spin-polarization direction for acting on the skyrmion or on the train of skyrmions.

The skyrmions 1 thus pass one after the other into the nanoplot 18. As explained above, when a skyrmion is found in the nanoplot 18, its size increases.

During each new passage of a skyrmion, the magneto-resistive element 19 thus detects the presence of an additional skyrmion by a magneto-resistive effect, which for example gives rise to implementation of a skyrmion counter.

A partial top view of a memory device 10 in an embodiment of the invention is illustrated in FIG. 1.

This memory device applies certain of the principles detailed above with reference to the different aspects of the invention. This memory device 10 includes a BS nanostructure according to the invention including a nanoplot 14, a source of skyrmions, and at least three nanoplots 11 each corresponding to a memory element, and a nanotrack connecting together the source nanoplot 14 and the memory element nanoplots 11.

The nanotrack allows displacement of the skyrmions by spin transfer in the form of trains, notably allowing an embodiment of the shift register type. The width of the nanotrack is for example of a few tens of nm.

Magneto-resistive elements 12 are positioned at each of the nanoplots 11. A magneto-resistive element 15 is further positioned at the source nanoplot 14.

Means for injecting current at the nanotrack of source 14 are adapted for generating a skyrmion during a generation command. The generation of this skyrmion is detected by the magneto-resistive element 15. The detection (or the counting) is facilitated by the widened area exhibited by the source nanoplot 14, which allows an increased size of the generated skyrmion and therefore detection is facilitated.

Each skyrmion, once it is generated, is displaced by means of a spin transfer effect towards the nanotrack 13.

Subsequently to the receiving of a reading command designating one of the memory element nanoplots 11, the memory device 10 is adapted for determining the number of skyrmions present in the designated nanoplot 11, by means of the magneto-resistive element 12 located at the designated nanoplot 11, and for inferring therefrom the state of the designated nanoplot 11 according to a known correspondence between number of skyrmions and respective states of memory elements.

Subsequently to receiving a writing command designated one of the memory element nanoplots 11 and further designating a state to be written, the memory device 10 is adapted for determining the target number of skyrmions to appear in the designated nanoplot 11 depending on the designated state to be written, and according to a known correspondence between numbers of skyrmions and respective states of memory elements.

Next, the memory device 10 controls the reading of the number of skyrmions currently present in the designated nanoplot 11, by means of the magneto-resistive element 12 located at the designated nanoplot 11, and if necessary inferring therefrom a number N (N>1) of skyrmions to be added or to be suppressed in the nanoplot 11 so that the resulting number is equal to the target number.

In the cases of N skyrmions to be suppressed, the memory device 10 then controls extraction of N skyrmions from the designated nanoplot 11, intended for the nanotrack 13 by displacement via a spin transfer effect. Each extraction of a skyrmion is for example confirmed by an operation for reading the designated nanoplot 11.

In the case of N skyrmions to be added, the memory device 10 then controls an insertion of N skyrmions into the designated nanoplot 11, from the nanotrack 13 by displacement via spin transfer effect. Each insertion of a skyrmion is for example confirmed by an operation for reading the designated nanoplot 11. Commands for creating skyrmions may further be applied in the case when the nanotrack would not include a sufficient amount of available skyrmions.

Suppression of the Skyrmions

In an embodiment, the memory device 10 is adapted for suppressing a skyrmion by displacing it in a region of the device in which the magnetic properties have been modified (different magnetic anisotropy) or else the magnetic film thickness has been increased (since the DM interaction is purely interfacial) or else further the inversion symmetry breaking is no longer present which may be made by placing above the magnetic layer of the memory device, a film of the material with strong SOC of the same thickness as the one which is underneath.

Thus the invention proposes the utilization of the intrinsic properties of the magnetic structures which the skyrmions are, as a basic element of non-volatile magnetic memories, and the use of the number of skyrmions and/or the electric resistance associated with the chiral configuration of the skyrmion(s), as parameters defining states of a multi-state memory.

A memory device according to the invention includes means for injecting and stabilizing skyrmions in BS nanostructures of variable shapes (discs, single tracks, nanocircuits, etc . . . ), and in certain embodiments, means for guiding skyrmions by localized modifications of the magnetic properties of the materials (magnetic anisotropy and/or spin-orbit interaction).

The use of skyrmions in a controlled number provides multiple advantages:

as the dimensions of the skyrmions are defined by competitions between different energy terms of the relevant systems (and therefore controllable), they may attain ultimate limits of the order of a few atomic cells (less than one nanometer), which gives the possibility of solving the problem of increasing the stored information density;

the internal structure of the skyrmions a priori makes them much less sensitive to structural and/or magnetic defects due for example to nano-manufacturing, and therefore facilitates their displacement, by a spin transfer effect, thereby reducing the energy cost of the operation of the memory device.

The invention further proposes solutions for stabilizing and injecting skyrmions in the memory elements of the device. Further, the invention provides a solution for strongly modulating in the memory device the dimensions of the individual skyrmions, i.e. for allowing an increase in the dimensions of the skyrmions during reading, for facilitating the reading thereof by a magneto-resistive effect, while allowing a reduction in the dimensions of the skyrmions outside these reading operations notably, giving rise to a high storage density and a strong integration level.

The invention may be applied in memories of the STT-MRAM type (Spin Transfer Torque Magnetic Random Access Memory) for example, or further in shift register type memories, for example based on magnetic bubbles and/or domain walls.

The invention claimed is:

1. A memory device, comprising at least one spintronic element adapted for representing a state from among at least n states associated with the spintronic element, n >1, each of the n states being associated with at least one characteristic of a set of magnetic skyrmions in the spintronic element, and said characteristic associated with a state n °i being distinct from said characteristic associated with a state n °j when the states n °i and j are two distinct states from among the n states, and wherein said at least one characteristic represents a number of magnetic skyrmion(s) present in the spintronic element and/or an electric resistance level of the set of the magnetic skyrmion(s).

2. The memory device according to claim 1, comprising state writing means adapted for receiving an identifier of a state from among said at least n states and adapted for modifying the set of the magnetic skyrmions in the spintronic element so that the characteristic of the modified set of skyrmions is equal to a predefined value associated with the state identified by the received identifier.

3. The memory device according to claim 2, wherein the comprise means for generating skyrmion(s) adapted for locally applying to the spintronic element, or to another spintronic element in the memory device and connected to the spintronic element by a track for displacement of the skyrmions, a spin-polarized current or a local electric field or a local magnetic field for generating a determined number of skyrmion(s).

4. The memory device according to claim 3, wherein the means for generating skyrmion(s) are adapted for energetically stabilizing the state of said element or other spintronic element depending on the number of skyrmions to be generated and on the relationship between the magnetic energy and chiral magnetic interaction of the spintronic element.

5. The memory device according to claim 4, wherein the state writing means comprise means for stabilizing said skyrmion(s) generated on said element, or other spintronic element, by modifying at least one magnetic parameter on the edges of said element or other spintronic element.

6. The memory device according to claim 4, wherein the state writing means comprise means for stabilizing said skyrmion(s) generated on said element or other spintronic element, by modifying at least one magnetic parameter by using a piezoelectric device adapted for changing the structural parameters of said element or other spintronic element.

7. The memory device according to claim 1, wherein the state writing means comprise at least one track and comprise means for displacing skyrmions by spin transfer effect adapted for introducing skyrmion(s) from the track into the spintronic element and/or for extracting skyrmion(s) from the spintronic element to the track.

8. The memory device according to claim 1, comprising state reading means adapted for measuring the magneto-resistance of said spintronic element or of another spintronic element of the memory device and for determining, according to at least said measured magneto-resistance, the state associated with the spintronic element from among the n states.

9. The memory device according to claim 8, wherein said state reading means are adapted for determining, according to at least said measured magneto-resistance, a number of skyrmions present in said spintronic element and for inferring therefrom the state of the spintronic element as equal to the state associated with said determined number of skyrmions.

10. The memory device according to claim 1, comprising a track allowing displacement of skyrmions, one after the other, by a spin transfer effect, comprising, in a point along the track, a widened area and adapted reading means for measuring the electric resistance of a spintronic element in the widened area.

11. The memory device according to claim 1, wherein said spintronic element comprises at least one ferromagnetic layer comprising at least one material from among Fe, Co or Ni, a simple or double ferromagnetic perovskite based on Ti, Cr, Mn, Fe, Co, Mo or Ru, a Heusler alloy based on Fe, Co or Ni or a magnetic semi-conductor, said ferromagnetic layer being interfaced with a non-magnetic layer.

12. The memory device according to claim 1, wherein said spintronic element comprises at least one non-magnetic layer comprising at least one material from among the elements Pt, W, Ir, Re, Ta, Pb, Bi, Rh, Pd, Mo, Cu or further Sm, Gd, Tb or Er, said non-magnetic layer being interfaced with a ferromagnetic layer or a stack of ferromagnetic and/or non-magnetic layer(s).

13. A processing method in a memory device that comprises at least one spintronic element adapted for representing a state from among at least n states associated with a spintronic element, n >1, said method comprising associating each of the n states with at least one characteristic of a set of magnetic skyrmions in the spintronic element, said characteristic associated with a state n °i being distinct from said characteristic associated with a state n °j when the states n °i and j are two distinct states from among the n states, and wherein said at least one characteristic represents a number of magnetic skyrmion(s) present in the spintronic element and/or an electric resistance level of the set of the magnetic skyrmion(s).

* * * * *